(12) United States Patent
Hoenigschmid

(10) Patent No.: US 6,490,194 B2
(45) Date of Patent: Dec. 3, 2002

(54) SERIAL MRAM DEVICE

(75) Inventor: Heinz Hoenigschmid, Essex Junction, VT (US)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/967,662

(22) Filed: Sep. 27, 2001

(65) Prior Publication Data

US 2002/0097598 A1 Jul. 25, 2002

Related U.S. Application Data

(60) Provisional application No. 60/263,931, filed on Jan. 24, 2001.

(51) Int. Cl.$^7$ ............................................. G11C 11/14
(52) U.S. Cl. ..................... 365/171; 365/173; 365/158
(58) Field of Search ........................... 365/97, 158, 173, 365/171

(56) References Cited

U.S. PATENT DOCUMENTS

| | | | | |
|---|---|---|---|---|
| 5,734,605 A | * | 3/1998 | Zhu et al. | ............... 365/158 |
| 5,978,257 A | | 11/1999 | Zhu et al. | |
| 6,331,943 B1 | * | 12/2001 | Naji et al. | ............... 365/158 |
| 6,365,419 B1 | | 4/2002 | Durlam et al. | |

* cited by examiner

Primary Examiner—Huan Hoang
(74) Attorney, Agent, or Firm—Slater & Matsil, L.L.P.

(57) ABSTRACT

An MRAM device (100) and method of manufacturing thereof having magnetic memory storage cells or stacks (MS0, MS1, MS2, MS3) coupled together in series. Devices (X0, X1, X2, and X3) are coupled in parallel to each magnetic memory storage cell (MS0, MS1, MS2, MS3). The active area (AA) is continuous, and contact vias (VU1, VL1, VU2, VL2 and VU3) are shared by magnetic stacks (MS0, MS1, MS2, MS3). N+ regions (108, 110, 112, 114, 116, 118) are coupled together by devices (X0, X1, X2, and X3).

21 Claims, 2 Drawing Sheets

SERIAL MRAM DEVICE

This patent claims the benefit of U.S. Provisional Patent Application Serial No. 60/263,931, filed Jan. 24, 2001, which is incorporated herein by reference.

TECHNICAL FIELD

The present invention relates generally to the fabrication of semiconductor devices, and more particularly to magnetic random access memory (MRAM) devices.

BACKGROUND OF THE INVENTION

Semiconductors are used for integrated circuits for electronic applications, including radios, televisions, cell phones, and personal computing devices, as examples. One type of semiconductor device is a semiconductor storage device, such as a dynamic random access memory (DRAM) and flash memory, which use a charge to store information.

A more recent development in memory devices involves spin electronics, which combines semiconductor technology and magnetics. The spin of an electron, rather than the charge, is used to indicate the presence of a "1" or "0". One such spin electronic device is a magnetic random-access memory (MRAM), which includes conductive lines positioned perpendicular to one another in different metal layers, the conductive lines sandwiching a magnetic stack. The place where the conductive lines intersect is called a crosspoint. A current flowing through one of the conductive lines generates a magnetic field around the conductive line and orients the magnetic polarity into a certain direction along the wire or conductive line. A current flowing through the other conductive line induces the magnetic field and can partially turn the magnetic polarity, also. Digital information, represented as a "0" or "1", is storable in the alignment of magnetic moments. The resistance of the magnetic component depends on the moment's alignment. The stored state is read from the element by detecting the component's resistive state. A memory cell may be constructed by placing the conductive lines and cross-points in a matrix structure having rows and columns.

An advantage of MRAMs compared to traditional semiconductor memory devices such as DRAMs is that MRAMs are non-volatile. For example, a personal computer (PC) utilizing MRAMs would not have a long "boot-up" time as with conventional PCs that utilize DRAMs. Also, an MRAM does not need to be powered up and has the capability of "remembering" the stored data.

SUMMARY OF THE INVENTION

Preferred embodiments of the present invention achieve technical advantages as an MRAM device having magnetic memory storage cells coupled together in series.

In one embodiment, a resistive semiconductor device includes a plurality of magnetic memory storage cells disposed over a substrate. Each storage cell includes a first end and a second end, and the storage cells are coupled in series to one another so that a first end of one of the storage cells is coupled to a second end of an adjacent one of the storage cells.

In another embodiment, an MRAM semiconductor device includes a first transistor having a gate, a first source/drain region and second source/drain region disposed on a substrate. A second transistor includes a gate, a first source/drain region and a second source/drain region, and the second transistor first source/drain region is coupled to the first transistor second source/drain region. A first magnetic stack having a first end and a second end is coupled at its first end to the first transistor first source/drain region. The first magnetic stack second end is coupled to the first transistor second source/drain region. A second magnetic stack having a first end and a second end is coupled at its first end to the second transistor first source/drain region. The second magnetic stack second end is coupled to the second transistor second source/drain region.

In another embodiment, a method of manufacturing an MRAM semiconductor device includes forming a plurality of magnetic memory storage cells over a substrate. Each storage cell includes a first end and a second end. The storage cells are coupled together in series to one another so that a first end of one of the storage cells is coupled to a second end of an adjacent one of the storage cells.

Advantages of embodiments of the invention include providing an MRAM device with a smaller cell layout area than in the prior art. Lower power is consumed by the use of optional depletion devices in a preferred embodiment.

BRIEF DESCRIPTION OF THE DRAWINGS

The above features of the present invention will be more clearly understood from consideration of the following descriptions in connection with accompanying drawings in which.

Corresponding numerals and symbols in the different figures refer to corresponding parts unless otherwise indicated. The figures are drawn to clearly illustrate the relevant aspects of the preferred embodiments and are not necessarily drawn to scale.

DETAILED DESCRIPTION OF PREFERRED EMBODIMENTS

Prior art MRAM designs will be described, followed by a discussion of some preferred embodiments and some advantages of the present invention.

Figure 1:
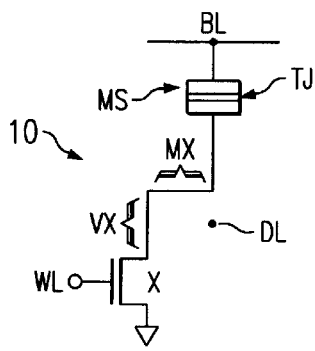
FIG. 1 illustrates a schematic of a prior art MRAM cell.

A transistor MRAM cell design may reach cell sizes ranging between $6F^2$ to $8F^2$ (where F is the minimum feature size). For example, FIG. 1 illustrates a schematic of a prior art MRAM cell 10 design having a minimum feature size of $6F^2$ or greater. Device X comprises a transistor having a gate, source and drain. The transistor X gate is coupled to a wordline WL. The transistor X drain is coupled to ground. The transistor X source is coupled to contact via VX, and via VX is coupled to a conductive material MX.

Conductive material MX is coupled to a magnetic stack MS that includes a tunnel junction TJ disposed between two stacks of magnetic materials. The other side the magnetic stack MS is coupled to a bitline BL. A digitline DL runs perpendicular to the plane of the page, represented by the point at DL.

A logic state is storable in the TJ which is detectable by determining the resistance, e.g., 10 kΩ for a low logic state and 12 kΩ for a high logic state, as examples. To read the stored logic state in the TJ, activating or switching on the wordline WL activates transistor X, making a connection from ground through device X over VX and MX through the TJ into the bitline BL. The resistive state of the TJ is determinable by measuring the current through the bitline BL.

To write a logic state to the TJ of the magnetic memory cell MS, a current is run through the DL and BL which run perpendicular to one another. The superposition of the electromagnetic fields produced by the DL and BL currents writes a logic state to the TJ by altering the resistive state of the TJ.

Figure 2:
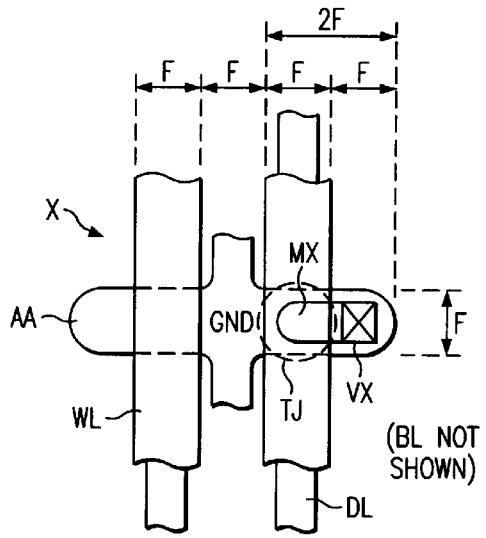
FIG. 2 shows a top view of a circuit layout of the prior art MRAM cell shown in FIG. 1.

FIG. 2 shows a top view of a layout of the prior art magnetic memory cell circuit 10 shown in FIG. 1. Active area AA on a lower level within a semiconductor wafer is connected to ground. Wordline WL is disposed over the active area AA and forms the gate of device X (not shown). One source/drain region of device X is coupled to ground while the other is coupled to the tunnel junction TJ. The ground area may be seen between the two wordlines WL.

On the right side of FIG. 2, area VX represents the VX contact coupling the grounded active area AA to the metal contact area MX. MX couples VX to the tunnel junction TJ which is disposed near wordline WL. The TJ is coupled to the underlying MX. Although the bitline BL is not shown, it runs along the top of the active area AA in a horizontal direction.

In the prior art MRAM cell 10 shown in FIGS. 1 and 2, the wordline WL width is F and the distance between the wordlines is F. The VX contact is F wide and F high. The MX is F×2F and the TJ element is F×F. The BL pitch is 2F and the WL pitch is 3F. Therefore, the minimum feature size attainable with this design approach is $6F^2$.

Semiconductor devices such as MRAMs devices are continually being scaled down in size to meet the miniaturization demands of electronic devices. What is needed in the art is an MRAM semiconductor device having a smaller minimum feature size.

Embodiments of the present invention achieve a smaller feature size by coupling a plurality of magnetic storage cells together in series. A continuous active area is used, rather than having a separate active area for each magnetic memory cell. Contact vias are shared amongst the serial magnetic storage cells.

Figure 3:
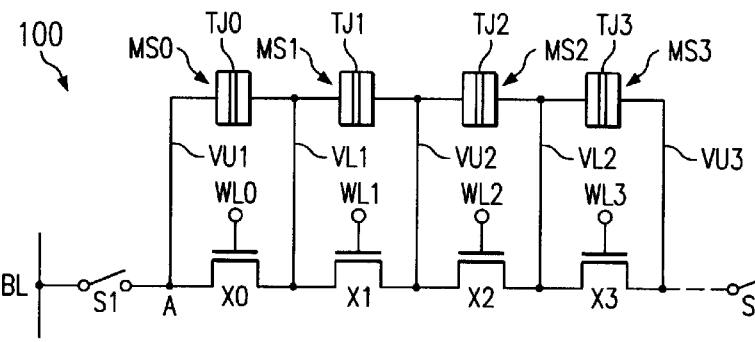
FIG. 3 shows a schematic of a preferred embodiment of the present invention.

A schematic of a preferred embodiment 100 of the present invention is shown in FIG. 3. A plurality, e.g. two or more, magnetic stacks MS0, MS1, MS2 and MS3 are coupled together in series. Devices X0, X1, X2 and X3 are coupled in parallel to each magnetic stack MS0, MS1, MS2 and MS3, respectively, as shown. Devices X0, X1, X2 and X3 preferably comprise enhancement transistors and may alternatively comprise depletion devices, as will be described further herein.

Each device X0, X1, X2 and X3 is coupled at its gate to a wordline, in particular, to wordlines WL0, WL1, WL2, and WL3, respectively. The drain and source of adjacent devices are coupled together. For example, the drain of device X0 is coupled to the source of device X1. The drain of device X3 is coupled to ground.

Each of the magnetic stacks MS0, MS1, MS2 and MS3 comprise a tunnel junction TJ0, TJ1, TJ2 and TJ3, respectively, the tunnel junctions TJ0, TJ1, TJ2 and TJ3 being adapted to store a logic state. The magnetic stacks MS0, MS1, MS2 and MS3 are accessible by running a current through the bitline BL to a sense amplifier, not shown.

An optional select switch Si may be coupled from node A to the bitline BL. Select switch S1 allows the magnetic stacks MS0, MS1, MS2 and MS3 to be addressed as a group. Vias VU1, VU2, VU3, VL1 and VL2 represent vias coupling devices X0, X1, X2 and X3 to magnetic stacks MS0, MS1, MS2 and MS3, to be described further herein.

Alternatively, optional select switch S1 may be coupled from ground to the source/drain of device X3, as shown in phantom in FIG. 3. In this embodiment, because one side of switch S1 is directly connected to ground, there is no backbias effect, which is advantageous.

FIG. 3 shows four tunnel junctions TJ0, TJ1, TJ2 and TJ3 coupled together in series, with each tunnel junction TJ0, TJ1, TJ2 and TJ3 being coupled in parallel to a device X0, X1, X2 and X3, respectively. However, in accordance with preferred embodiments of the invention, two or more TJ's and devices X may be utilized, e.g., 2, 4, 6, 8, or more as examples. Although preferably an even number of magnetic memory cells MS0, MS1, MS2 and MS3 are coupled in series, alternatively, an odd number of memory cells may be used.

Reading the contents of a particular magnetic stack, e.g., cell MS2 (the logic state stored at TJ2) of circuit 100 will next be described. Devices X0, X1 and X3 are switched on. This results in current running from the right side, from ground, through device X3. Because device X2 is switched off, current passes through memory cell MS2. Because devices X1 and X0 are switched on, current passes through X1 and X0, into the bitline BL. Note that to achieve this current path, optional switch S1 is closed. By measuring this current flowing through TJ2, the resistive or logic state of the memory cell MS2 can be determined.

By switching off one device and switching on the other three devices, current may be passed through each cell MS0, MS1, MS2 and MS3, as required, to the bitline, to determine the logic state of the desired magnetic memory cells. A current is passed through the desired cell MS0, MS1, MS2, and MS3 in order to read the logic state.

Note that the group or chain of cells TJ0, TJ1, TJ2 and TJ3 may be coupled directly to the bitline BL at node A. Rather than coupling each cell to the bitline directly, the entire chain is coupled to the bitline BL at node A.

Figure 4:
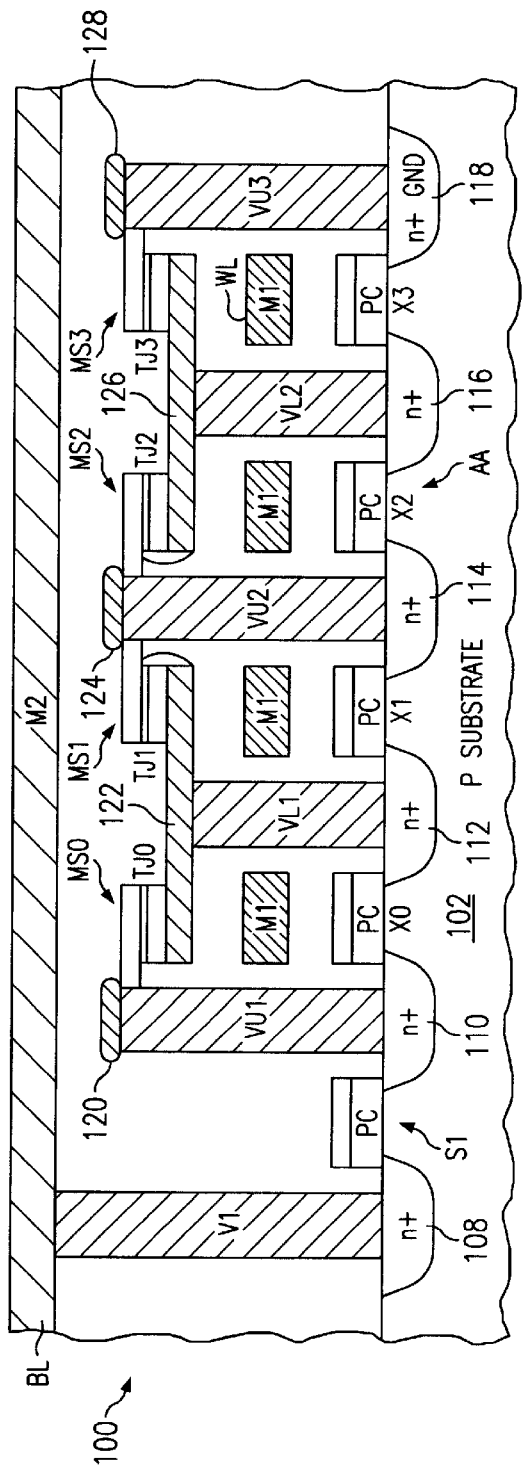
FIG. 4 illustrates a cross-sectional view of a preferred embodiment of the present invention.

FIG. 4 shows a cross-sectional view of the preferred embodiment 100 shown in the schematic of FIG. 3. A semiconductor wafer having a substrate 102 is provided. The substrate 102 may comprise a p substrate, for example. An active area AA is formed within the substrate. Preferably, the active area is continuous, and comprises a plurality of adjacent n+ regions 108, 110, 112, 114, 116, 118. The last n+ region 118 is coupled to ground, as shown.

Wordline WL may be part of a first conducting layer, digitline DL (not shown) may be part of a second conducting layer, and bitline BL may be part of a third conducting layer, as examples. The conducting layers may comprise a polysilicon conductor (PC), for example. Via V1 couples bitline BL to n+ region 108.

The n+ region 108 comprises the source of switch S1. The n+ region 110 comprises the drain of device S1 as well as the source of device X0. Similarly, the n+ regions 112, 114, 116, and 118 comprise the drain and sources of devices X0, X1, X2 and X3. The drain and source regions of the various devices X0, X1, X2 and X3 are shared within the n+ regions. Advantageously, the active area AA is a continuous area.

Upper vias VU and lower vias VL couple the magnetic stacks to the active areas. For example, upper via VU1 couples one side of magnetic stack MS0 to n+ diffusion area 110, and lower via VL1 couples the other side of magnetic stack MS0 to n+ diffusion area 112. The other magnetic stacks MS1, MS2 and MS3 are coupled to underlying diffusion areas similarly by VL1, VU2, VL2 and VU3. Metal plates 120/122/124/126/128 may be disposed over the top of the vias VU1, VL1, VU2, VL2, VU3, respectively, to facilitate the electrical connection of the vias VU1, VL1, VU2, VL2 and VU3 to the magnetic stacks MS0, MS1, MS2 and MS3, as an example.

The two diffusion areas 110 and 112 form the source and drain of device X0. The gate of device X0 comprises the wordline WL, and the digitline DL comprises M1. Similarly, the other diffusion areas 112 and 114, 114 and 116, and 116 and 118 form the source/drain regions of devices X1, X2 and X3, respectively. Diffusion area 118 is coupled to ground.

The preferred embodiment shown in FIGS. 3 and 4 comprises shared diffusion regions 110/112/114 and 116. Furthermore, several contact vias are also shared, e.g., lower via VL1 is shared by cells MS0 and MS1, and upper via VU2 is shared by MS1 and MS2, as examples. In the prior art MRAM cell shown in FIGS. 1 and 2, only ground diffusion regions for multiple MRAM cells are shared, and one contact via VX exists for each device 10.

One novel feature of preferred embodiments of the present invention is that the tunnel junction or magnetic memory cells are not directly connected to a bitline, wordline or digitline. Rather, as can be seen in FIG. 4, the bitline BL is not in direct electrical contact to magnetic stacks MS0, MS1, MS2 or MS3 or wordlines WL. In contrast, in the prior art MRAM cell shown in FIG. 1, the bitline BL is directly coupled to the magnetic stack MS or tunnel junction TJ.

Coupling the magnetic stacks MS0, MS1, MS2 and MS3 in series is another novel feature of preferred embodiments of the present invention. The series configuration of the illustrated embodiments herein results in bi-directional current through the magnetic stacks MS0, MS1, MS2 and MS3, e.g., in particular, through the tunnel junctions TJ0, TJ1, TJ2 and TJ3. For example, current flows from top to bottom for MS3/TJ3, and current flows from bottom to top for MS2/TJ2. Depending on the location of the magnetic stack/tunnel junction within the structure 100, the current may flow in either direction.

More particularly, in accordance with embodiments of the present invention, the current runs in the same direction through magnetic stacks MS0, MS2, etc. and the current runs in the same, opposite direction for magnetic stacks MS1, MS3, etc. In prior art MRAM designs, current runs in the same direction, e.g., uni-directionally, through the magnetic stack/tunnel junctions.

Figure 5:
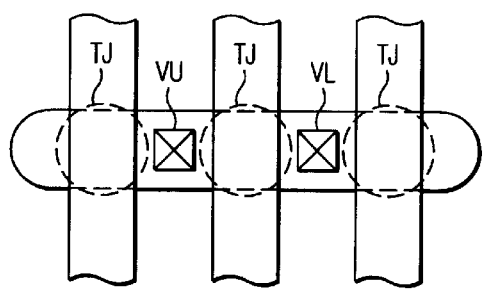
FIG. 5 shows a top view of the circuit layout of the embodiment shown in FIG. 4.

FIG. 5 shows a top view of the device 100 shown in FIG. 4, having a minimum feature size of 4F² (2F BL pitch×2F WL pitch). This is advantageous in that embodiments of the present invention achieve a smaller cell area than prior art MRAM designs.

Figure 6:
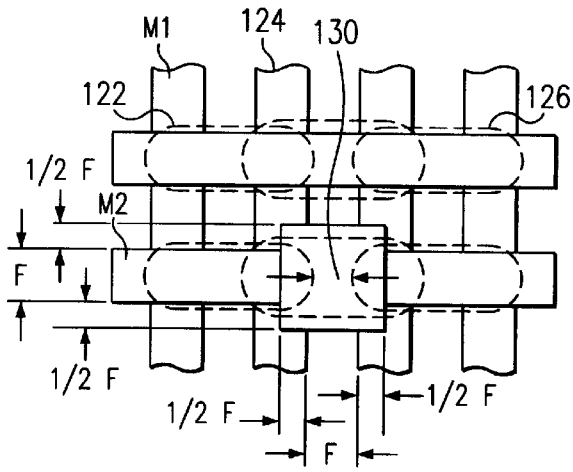
FIG. 6 shows a top view with the metallization layers in view.

FIG. 6 shows another top view of an embodiment of the present invention, with the metallization lines M1 and M2 comprising bitlines and wordlines in view. M2 may comprise the bitlines and program lines, and M1 may comprise the wordline stitch and enable lines, for example. Rectangle 130 illustrates the unit cell comprising a feature size of:

$$(\tfrac{1}{2}F+F+\tfrac{1}{2}F)\times(\tfrac{1}{2}F+F+\tfrac{1}{2}F)=4F^2$$

Figure 7:
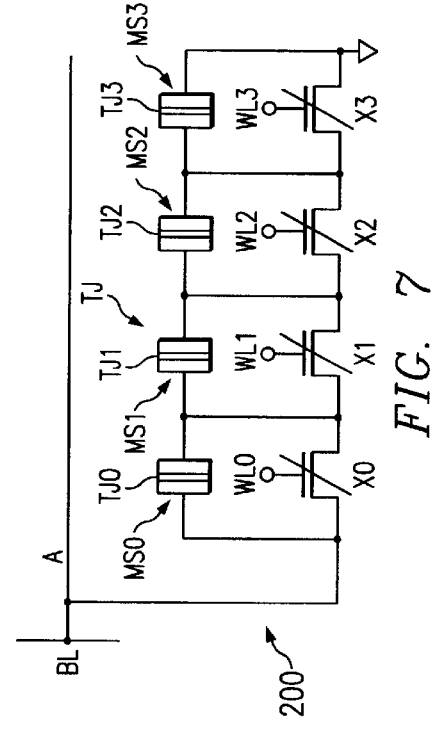
FIG. 7 shows a schematic of another preferred embodiment of the present invention.

FIG. 7 shows another preferred embodiment 200 of the present invention, in which the devices X0, X1, X2 and X3 comprise depletion devices. The use of depletion devices X0, X1, X2 and X3 is advantageous in that a power savings is achieved. A depletion device X0, X1, X2 and X3 is always in depletion, or conducting, without voltage applied to the gate of the depletion device. In the embodiment 100 shown in FIG. 3, a voltage of, for example, 1.8 volts may be applied to devices X0, X1, X2 and X3 for magnetic storage cells not desired to be read, and the magnetic storage cell to be read would have zero volts applied to the device gate. However, in the embodiment shown in FIG. 7, because the chain of depletion devices X0, X1, X2 and X3 always remains on, the desired memory cell can be selected by switching off one depletion device by applying, for example, −1.8 V at the gate of the desired depletion device X0, X1, X2 and X3, resulting in a power savings.

Figure 8:
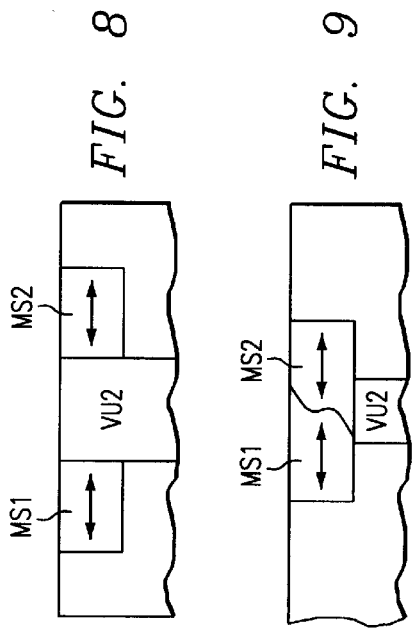
FIGS. 8 and 9 show preferred embodiments of making connection to the free magnetic layer.
Figure 9:
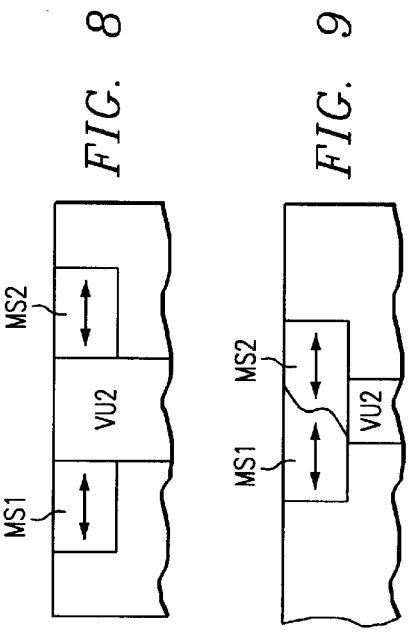

FIGS. 8 and 9 show cross-sectional views of alternative methods of making contact to the free magnetic layer. A portion of via VU2 may be coupled directly to metal stacks MS1 and MS2, as shown. In FIG. 4, metal plate 124 has a particular height, which is disadvantageous, because distance is added from the BL to the free layer. By removing metal plate 124 as shown in FIGS. 8 and 9, the distance is reduced from the BL to the free layer, which is advantageous.

Embodiments of the present invention achieve technical advantages as an MRAM device 100/200 having magnetic storage cells MS0, MS1, MS2, MS3 coupled together in series. A series group of MRAM storage cells MS0, MS1, MS2, MS3 is addressable as a group at node A by optional select switch S1. There is no direct connection of the magnetic storage cells MS0, MS1, MS2, MS3 to a bitline, wordline and/or digitline, in a preferred embodiment. Enhancement or depletion devices X0, X1, X2 and X3 may be used, resulting in a power savings. A smaller cell area for MRAM cell 100/200, in particular, of a 4F² size, may be achieved by sharing contact vias VU and VL, by sharing a continuous active area AA among several magnetic storage cells MS0, MS1, MS2 and MS3, and by coupling the magnetic stacks MS0, MS1, MS2 and MS3 and tunnel junctions TJ0, TJ1, TJ2 and TJ3 in series.

Embodiments of the invention are described with reference to a particular application for an MRAM cell herein; however, embodiments of the invention also have application in other resistive semiconductor devices.

While the invention has been described with reference to illustrative embodiments, this description is not intended to be construed in a limiting sense. Various modifications in combinations of the illustrative embodiments, as well as other embodiments of the invention, will be apparent to persons skilled in the art upon reference to the description. In addition, the order of process steps may be rearranged by one of ordinary skill in the art, yet still be within the scope of the present invention. It is therefore intended that the appended claims encompass any such modifications or embodiments. Moreover, the scope of the present application is not intended to be limited to the particular embodiments of the process, machine, manufacture, composition of matter, means, methods and steps described in the specification. Accordingly, the appended claims are intended to include within their scope such processes, machines, manufacture, compositions of matter, means, methods, or steps.

What is claimed is:

1. A resistive semiconductor device, comprising:
   a semiconductor substrate;
   a plurality of magnetic memory storage cells disposed over the substrate, each storage cell including a first end and a second end, the storage cells being coupled in series to one another so that a first end of one of the storage cells is coupled to a second end of an adjacent one of the storage cells; and
   a plurality of transistors, a respective one of the transistors being coupled in parallel to each memory storage cell, the transistors coupled in series to one another, the transistors being adapted to control access to the memory storage cells, wherein the transistors comprise depletion devices.

2. The resistive semiconductor device according to claim 1, wherein the cells are magnetic random-access memory (MRAM) cells.

3. The resistive semiconductor device according to claim 2, wherein the magnetic memory storage cells comprise magnetic stacks, the magnetic stacks including a tunnel junction, wherein a logic state is storable in each magnetic stack.

4. The resistive semiconductor device according to claim 3, wherein data stored in each memory storage cell is accessed by turning on at least one of the transistors.

5. The resistive semiconductor device according to claim 4, further comprising a plurality of wordlines, bitlines and digitlines proximate the memory storage cells, wherein the magnetic stacks are not coupled directly to the wordlines, bitlines and digitlines.

6. The resistive semiconductor device according to claim 5, wherein current may be passed bidirectionally through the tunnel junctions.

7. The resistive semiconductor device according to claim 1, further comprising a plurality of vias coupling at least one side of each magnetic stack to an active area.

8. The resistive semiconductor device according to claim 7, wherein the active area is continuous and enables each of the plurality of transistors.

9. A magnetic random-access memory (MRAM) semiconductor device, comprising:
   a semiconductor substrate;
   a first transistor having a gate, a first source/drain region and second source/drain region disposed on the substrate;
   a second transistor having a gate, a first source/drain region and a second source/drain region, the second transistor first source/drain region being coupled to the first transistor second source/drain region;
   a first magnetic stack having a first end and a second end, the first magnetic stack first end being coupled to the first transistor first source/drain region by a first via extending upwardly from the first transistor first source/ region and abutting the first end of the first magnetic stack;
   a second magnetic stack having a first end and a second end, the second magnetic stack first end being coupled to the second transistor second source/drain region by a second via extending upwardly from the second transistor second source/drain region and abutting the first end of the second magnetic stack;
   a first conductor coupled to and extending between the second end of the first magnetic stack and the second end of the second magnetic stack;
   a third via extending upwardly from the first transistor second source/drain region to the first conductor;
   a first metal plate disposed over and abutting both the first via and the first magnetic stack first end; and
   a second metal plate disposed over and abutting both the second via and the second magnetic stack first end, the second metal plate being separate from the first metal plate.

10. The MRAM semiconductor device according to claim 9, further comprising:
    a first wordline coupled to the first transistor gate;
    a second wordline coupled to the second transistor gate; and
    a bitline coupled to the first transistor first source/drain region.

11. The MRAM semiconductor device according to claim 10, further comprising:
    a third transistor having a gate, a first source/drain region and a second source/drain region, the third transistor first source/drain region being coupled to the second transistor second source/drain region, the third transistor gate being coupled to a third wordline;
    a fourth transistor having a gate, a first source/drain region and a second source/drain region, the fourth transistor first source/drain region being coupled to the third transistor second source/drain region, the fourth transistor gate bring coupled to a fourth wordline;
    a third magnetic stack having a first end and a second end, the third magnetic stack first end being coupled to the second via;
    a fourth magnetic stack having a first end and a second end, the fourth magnetic stack first end being coupled to the fourth transistor second source/drain region by a fourth via;
    a second conductor coupled to and extending between the second end of the third magnetic stack and the second end of the fourth magnetic stack; and
    a fifth via extending upwardly from the third transistor second source/drain region to the second conductor;
    a third metal plate disposed over and abutting both the fourth via and the fourth magnetic stack first end, wherein the second metal plate is disposed over and abuts the third magnetic stack first end; and
    a ground node coupled to the fourth transistor second source/drain region.

12. The MRAM semiconductor device according to claim 11, further comprising a select switch coupled between the bitline and the first transistor first source/drain region.

13. The MRAM semiconductor device according to claim 11, further comprising a select switch coupled between the ground node and the fourth transistor second source/drain region.

14. The MRAM semiconductor device according to claim 11, wherein the first, second, third and fourth transistors comprise depletion devices.

15. The MRAM semiconductor device according to claim 11, wherein each magnetic stack includes a tunnel junction, wherein the tunnel junctions are not directly coupled to the bitline or wordlines.

16. A method of manufacturing a magnetic random-access memory (MRAM) semiconductor device, comprising:
    providing a semiconductor substrate;
    forming a plurality of magnetic memory storage cells over the substrate, each storage cell including a first end and a second end, wherein the storage cells are coupled together in series to one another so that a first end of one of the storage cells is coupled to a second end of an adjacent one of the storage cells; and coupling a transistor in parallel to each magnetic memory storage cell, the transistors being coupled in series to one another, wherein the transistors comprise depletion devices.

17. The method according to claim 16, further comprising disposing wordlines, bitlines and digitlines proximate the magnetic memory storage cells, wherein the wordlines, bitlines and digitlines are not directly coupled to the magnetic memory storage cells.

18. The method according to claim 16, further comprising coupling each magnetic memory storage cell to a single active area.

19. A magnetic random access memory (MRAM) device, comprising:
- a semiconductor region having a first doped region, a second doped region, a third doped region, a fourth doped region and a fifth doped region formed therein, the fifth doped region being coupled to a ground;
- a first gate disposed above a portion of the semiconductor region between the first and second doped regions, the first gate being coupled to a first wordline;
- a second gate disposed above a portion of the semiconductor region between the second and third doped regions, the second gate being coupled to a second wordline;
- a single first via extending upwardly from the first doped region, the first via having an upper end;
- a first magnetic tunnel junction (MTJ) stack having a first end abutting the upper end of the first via;
- a second MTJ stack disposed proximate the first MTJ;
- a first conductor disposed below and coupling the first MTJ stack to the second MTJ stack;
- a single second via extending downwardly from the first conductor to contact the second doped region;
- a single third via having an upper end extending upwardly from the third doped region, wherein the third via upper end abuts the second MTJ stack;
- a first metal plate disposed above and abutting both the first via upper end and the first MTJ stack;
- a second metal plate disposed above and abutting both the third via upper end and the second MTJ stack;
- a third gate disposed above a portion of the semiconductor region between the third and fourth doped regions, the third gate being coupled to a third wordline;
- a fourth gate disposed above a portion of the semiconductor region between the fourth and fifth doped regions, the fourth gate being coupled to a fourth wordline;
- a third MTJ stack abutting the third via upper end, wherein the second metal plate is disposed above and abuts the third MTJ stack;
- a fourth MTJ stack disposed proximate the third MTJ;
- a second conductor disposed below and coupling the third MTJ stack to the and fourth MTJ stack;
- a single fourth via extending downwardly from the second conductor to contact the fourth doped region;
- a single fifth via having an upper end extending upwardly from the fifth doped region, wherein the fifth via upper end abuts the fourth MTJ stack; and
- a third metal plate disposed above and abutting both the fifth via upper end and the fourth MTJ stack.

20. The MRAM device according to claim 19, wherein the first gate, a portion of the first doped region and a portion of the second doped region comprise a depletion device; wherein the second gate, a portion of the second doped region and a portion of the third doped region comprise a depletion device, wherein the third gate, a portion of the third doped region and a portion of the fourth doped region comprise a depletion device; and wherein the fourth gate, a portion of the fourth doped region and a portion of the fifth doped region comprise a depletion device.

21. The MRAM device according to claim 19, further comprising:
- a sixth doped region formed in the semiconductor region proximate the first doped region;
- a fifth gate disposed above a portion of the semiconductor region between the first and sixth doped regions; and
- a sixth via having an upper end extending upwardly from the sixth doped region, the sixth via upper end abutting a bitline.

* * * * *

UNITED STATES PATENT AND TRADEMARK OFFICE
CERTIFICATE OF CORRECTION

PATENT NO.    : 6,490,194 B2
DATED         : December 3, 2002
INVENTOR(S)   : Hoenigschmid It is certified that error appears in the above-identified patent and that said Letters Patent is hereby corrected as shown below:

Column 7,
Lines 54-55, the term "first source/region" should be corrected to read -- first source/drain region --.

Column 10,
Line 14, remove the word "and".

Signed and Sealed this

Twelfth Day of August, 2003

JAMES E. ROGAN
*Director of the United States Patent and Trademark Office*